United States Patent
Chang et al.

(10) Patent No.: US 7,952,443 B2
(45) Date of Patent: May 31, 2011

(54) OSCILLATING SYSTEM AND ASSISTANT MEASURING CIRCUIT FOR OSCILLATOR

(75) Inventors: Hong-Yeh Chang, Jhonghe (TW); Chi-Hsien Lin, Taichung (TW)

(73) Assignee: National Central University, Jhongli, Taoyuan County (TW)

( * ) Notice: Subject to any disclaimer, the term of this patent is extended or adjusted under 35 U.S.C. 154(b) by 288 days.

(21) Appl. No.: 12/256,996

(22) Filed: Oct. 23, 2008

(65) Prior Publication Data
US 2009/0302828 A1 Dec. 10, 2009

(30) Foreign Application Priority Data
Jun. 6, 2008 (TW) .............................. 97121095 A

(51) Int. Cl.
*H03B 5/12* (2006.01)
*H03B 5/24* (2006.01)
(52) U.S. Cl. ........ 331/108 R; 331/45; 331/57; 324/76.13
(58) Field of Classification Search ............... 331/45, 331/57, 108 R; 324/76.13
See application file for complete search history.

(56) References Cited

OTHER PUBLICATIONS

A 32GHz Quadrature LC-VCO in 0.25μm SiGe BiCMOS Technology; W.L. Chan, et al.; 2005 IEEE International Solid-State Circuits Conference; ISSCC 2005/Session 29/RF Techniques/29.5; pp. 538, 539, 616.
A 28-GHz Monolithic Integrated Quadrature Oscillator in SiGe Bipolar Technology; Sabine Hackl, et al.; IEEE Journal of Solid-State Circuits, vol. 38, No. 1, Jan. 2003; pp. 135-137.
A 45-GHz Quadrature Voltage Controlled Oscillators with a Reflection-Type IQ Modulator in 0.13-μm CMOS Technology; Hong-Yeh Chang et al.; Department of Electrical Engineering and Graduate Institute of Communication Engineering, National Taiwan University, Taipei, 106, Taiwan, R.O.C.; pp. 739-742, IEEE Jun. 2006.

*Primary Examiner* — Arnold Kinkead
*Assistant Examiner* — Richard Tan
(74) *Attorney, Agent, or Firm* — Jackson IPG PLLC; Demian K. Jackson

(57) ABSTRACT

An assistant measuring circuit for an oscillator is provided. The oscillator provides N oscillating signals with different phases. The assistant measuring circuit includes N buffers, N reflection-type modulators, and a controller. An ith buffer among the N buffers receives and further transmits an ith oscillating signal among the N oscillating signals. An ith modulator among the N modulators has an ith signal input end, an ith signal output end, and an ith signal control end. The ith oscillating signal is transmitted to the ith signal input end through the ith buffer. The signal output ends of the N modulators are all electrically connected to a measuring end. The controller is used for providing an ith control signal to the ith signal control end.

16 Claims, 5 Drawing Sheets

OSCILLATING SYSTEM AND ASSISTANT MEASURING CIRCUIT FOR OSCILLATOR

BACKGROUND OF THE INVENTION

1. Field of the Invention

The present invention relates to an oscillator and, more particularly, to an assistant measuring circuit for the oscillator.

2. Description of the Prior Art

A voltage-controlled oscillator, which mainly provides reference signals with different phases but of an identical amplitude, plays an important role in a wireless communication system. The reference signals are used as carrier signals for transmitting data, and the qualities of the signals relate to the whole performance of the wireless communication system. Take a wireless communication system of an orthogonal frequency division multiplexing (OFDM) technique for example. The bit error rate of the communication system will increase if the amplitude differences and phase errors among the reference signals increase. For a phase array receiver, the poor quality signals affect the radiation pattern severely.

In addition to the fabrication of a good voltage-controlled oscillator, investigating how reference signals can be measured is also an indispensable issue. Only by measuring the amplitude differences and phase errors of the reference signals accurately, can a circuit designer or a manufacturer of a wireless communication equipment determine whether an output signal of certain oscillator is qualified or not.

There are not many measuring methods disclosed in the prior art for an output signal of an oscillator, especially for the oscillator whose output signals have more than four phase outputs. Recently, for measuring the amplitude differences and phase errors of multiple-phase signals, the main measuring method is to measure the output signal of each phase by using a high-speed sampling oscilloscope. The above-mentioned measuring method is manifested in "A 28-GHz monolithic integrated quadrature oscillator in SiGe Bipolar Technology" which was presented by Sabine Hackl, et al. in IEEE Journal of Solid-State Circuits, vol. 38, no. 1, pp. 135-137, January 2003.

However, restricted by the deficiency of an instrument's measuring frequency and the difficulty to read the small phase difference, it is not easy to determine precisely the amplitude differences and phase errors among the signals. Besides, with practical affairs such as setting up the instrument and calibrating a coaxial cable, it is also a challenge to measure multiple output signals simultaneously.

On the other hand, another measuring method is manifested in "A 45-GHz Quadrature Voltage Controlled Oscillator with a Reflection-Type IQ Modulator in 0.13 μm CMOS Technology" presented by H. Y. Chang, et al. in IEEE MTT-S Int. Microwave Symp. Dig., pp. 739-742, June 2006, and manifested in "A 32 GHz quadrature LC-VCO in 0.25 μm SiGe BiCMOS Technology" presented by W. L. Chan, et al. in 2005 International Solid-State Circuit Conference Digest, San Francisco, USA, pp. 538-539. This measuring method is to add a quadrature modulator operated as an image-rejection up-converter in the oscillating circuit, and to measure a sideband suppression of the quadrature modulator to calculate the amplitude differences and phase errors of the output signals.

SUMMARY OF THE INVENTION

To solve the aforementioned problem, the main scope of the invention is to provide an assistant measuring circuit for an oscillator. According to the assistant measuring circuit of the invention, signals with different phases are integrated by plural reflection-type modulators. By adjusting each reflection-type modulator, the signals after integration are used for determining the amplitude differences and phase errors of the output signals. In addition to a simple structure and precise results, the main advantage of the assistant measuring circuit is to decrease the difficulty of measuring multiple-phase signals.

It is related to an assistant measuring circuit according to an embodiment of the invention. It is assumed that an oscillator which matches the assistant measuring circuit provides N oscillating signals with different phases. The assistant measuring circuit includes N buffers, N reflection-type modulators, and a controller. An ith buffer among the N buffers receives and further transmits an ith oscillating signal among the N oscillating signals. An ith modulator among the N modulators has an ith signal input end, an ith signal output end, and an ith signal control end. The ith oscillating signal is transmitted to the ith signal input end through the ith buffer. All the signal output ends of the N modulators are electrically connected to a measuring end. The controller is used for providing an ith control signal to the ith signal control end.

Another characteristic of the assistant measuring circuit, according to the invention, is a wide application on every kind of multiple-phase voltage-controlled oscillator. The applicant has applied the assistant measuring circuit of the invention to an eight-phase voltage-controlled oscillator and has proved that the amplitude differences and phase errors of the multiple-phase output signals are determined by the assistant measuring circuit of the invention successfully.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
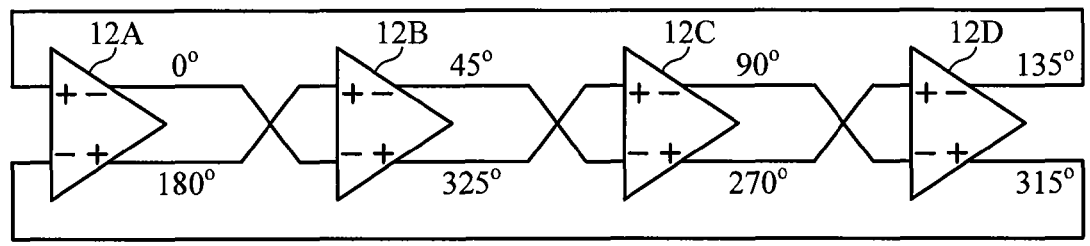
FIG. 1 is a typical structural view of an eight-phase ring oscillator.

Please refer to FIG. 1. FIG. 1 is a typical structural view of an eight-phase ring oscillator. The ring oscillator includes four cross-coupling oscillating units (12A~12D) and can provide oscillating signals with eight phases of 0°, 45°, 90°, 135°, 180°, 225°, 270°, and 315°.

Figure 2:
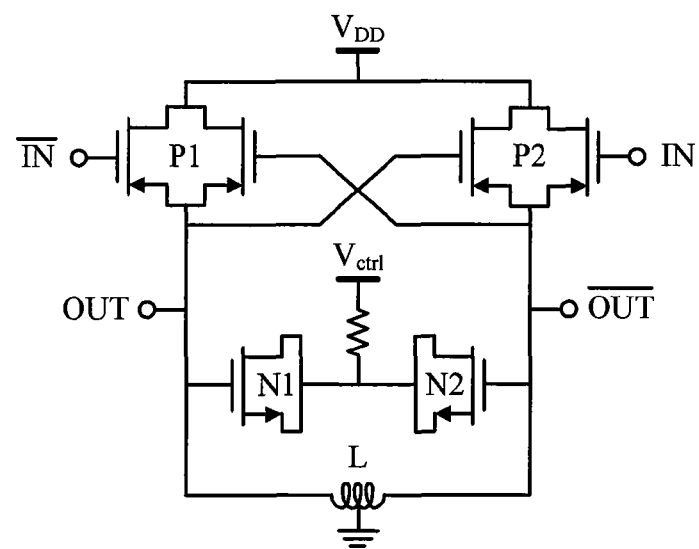
FIG. 2 is a circuit example of an oscillating unit.

FIG. 2 is a circuit example of an oscillating unit. In the oscillating unit, the inductance L and the variable capacitance diodes (N1 and N2) are used to construct the oscillating circuit. The cross couple of p-type metal-oxide-semiconductors (P1 and P2) provides a negative resistance for compensating an energy loss of the oscillating circuit. The four oscillating units, shown in FIG. 2, are connected to each other in a form of two parallelly connected couples (as shown in FIG. 1) to generate eight oscillating signals with an increment of 45°.

Since the working principle of the ring oscillator is well known to those skilled in this field, descriptions will not be repeated below.

Figure 3:
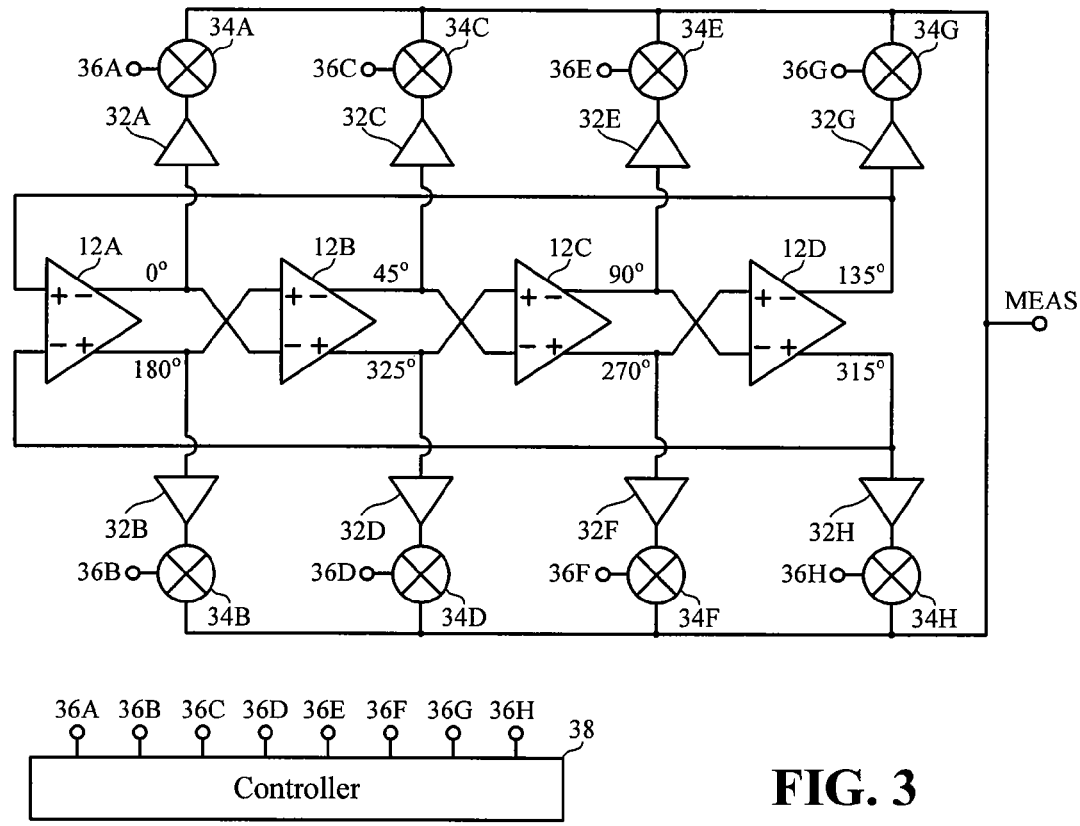
FIG. 3 is a schematic diagram of an assistant measuring circuit and an oscillator according to one embodiment of the invention.

Please refer to FIG. 3. FIG. 3 is a schematic diagram of an assistant measuring circuit and an oscillator according to one embodiment of the invention. The assistant measuring circuit contains eight buffers (32A~32H), eight reflection-type modulators (34A~34H), and a controller 38.

Each buffer, electrically connected to the oscillator, receives one of the above eight oscillating signals. For example, the buffer 32A, electrically connected to the oscillating unit 12A, receives an oscillating signal of 0° which is generated from the negative output end of the oscillating unit 12A. The main function of these buffers is to reduce the loads of the output ends of the oscillating units 12A~12D. In practical applications, these buffers can be common-gate amplifiers, common-source amplifiers, or common-drain amplifiers, but not limited therein.

According to the invention, each modulator has a signal input end, a signal output end, and a signal control end. As shown in FIG. 3, the signal output end of each buffer is electrically connected to a signal input end of a reflection-type modulator, and each said buffer can send the received oscillating signal to the reflection-type modulator. In other words, each reflection-type modulator in FIG. 3 also receives one of the eight oscillating signals.

As shown in FIG. 3, all the signal output ends of the reflection-type modulators (34A~34H) are electrically connected to a measuring end (MEAS). All the signal control ends of the reflection-type modulators (36A~36H) are electrically connected to the controller 38. By adjusting the voltages provided for the signal control ends (36A~36H) by the controller 38, a tester can change the signal measured at the measuring end.

Figure 4:
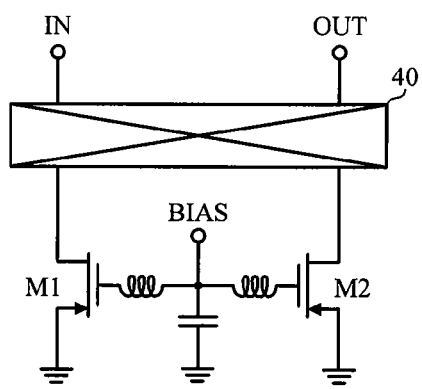
FIG. 4 is an example of the structure of a reflection-type modulator.

For example, each reflection-type modulator can contain a 90-degree hybrid and two cold-mold transistors. Please refer to FIG. 4. FIG. 4 is an example of the structure of such a reflection-type modulator. The two cold-mold transistors in this example are n-type MOSFETs (M1 and M2). The transistors (M1 and M2) are operated as switches, and their drains are electrically connected to the coupling port and direction port of the hybrid 40, respectively. In practical applications, the hybrid 40 can be a broadside coupler, a Lange coupler, or an edge coupler.

For the structure of the reflection-type modulator shown in FIG. 4, the controller 38 can change the reflection coefficient of the reflection-type modulator by adjusting the bias voltage at the bias node, i.e. the control end of the above reflection-type modulator, which is noted as BIAS in FIG. 4. For example, if the power supply can provide a voltage of 1.8V, the bias voltage at node BIAS can be selectively adjusted at 0V, 0.9V, or 1.8V by the controller 38.

When the voltage at node BIAS is 0V, the two n-type MOSFETs (M1 and M2) are closed, and the reflection coefficient of the reflection-type modulator is −1; therefore, the signal phase of the signal output end (OUT) falls behind that of the signal input end (IN) by 270°. When the voltage at node BIAS is 1.8V, the two n-type MOSFETs (M1 and M2) are opened, and the reflection coefficient of the reflection-type modulator is 1; the signal phase of the signal output end (OUT) leads that of the signal input end (IN) by 270°. In these two cases, the signal amplitudes of the signal output end and the signal input end of the reflection-type modulator are the same.

On the other hand, when the voltage at node BIAS is 0.9V, the reflection-type modulator is analogous to a resistor of 50Ω, and the input and output signals of the modulator are absorbed. Therefore, there is almost no signal in the signal output end of the modulator theoretically, i.e. the signal output end is closed.

For example, if the voltages provided for the signal control ends (36A~36H) by the controller circuit 38 are set at 1.8V, 0V, 0.9V, 0.9V, 1.8V, 0V, 0.9V, and 0.9V, respectively, then the signal output ends of the four reflection-type modulators (34C, 34D, 34G, and 34H) are closed. Besides, the signal phase of the output signal will lead that of the input signal by 270° in each of the two reflection-type modulators (34A and 34E). In addition, the signal phase of the output signal will fall behind that of the input signal by 270° in both reflection-type modulators (34B and 34F).

In other words, the reflection-type modulators for transmitting oscillating signals of 45°, 225°, 135°, and 315° are closed; the original signals of 0° and 270° are delayed by 90°, respectively; and the original signals of 90° and 180° are delayed by 270°, respectively. Therefore, the signals transmitted to the measuring end (MEAS) finally contain two signals of 270° and two signals of 180°, i.e. two sets of quadrature signals.

When the settings in the above example are being adopted, the assistant measuring circuit in accordance with the invention can be treated as an image-rejection up-converter. Therefore, the amplitude differences and phase errors of the multiple-phase signals from the ring oscillator can be determined by measuring the side-band and the amount of the carrier suppression of the output signal from the measuring end (MEAS). Also, the output frequency and output power of the ring oscillator can be determined by measuring the spectrum of the output signal from the measuring end (MEAS).

Figure 5:
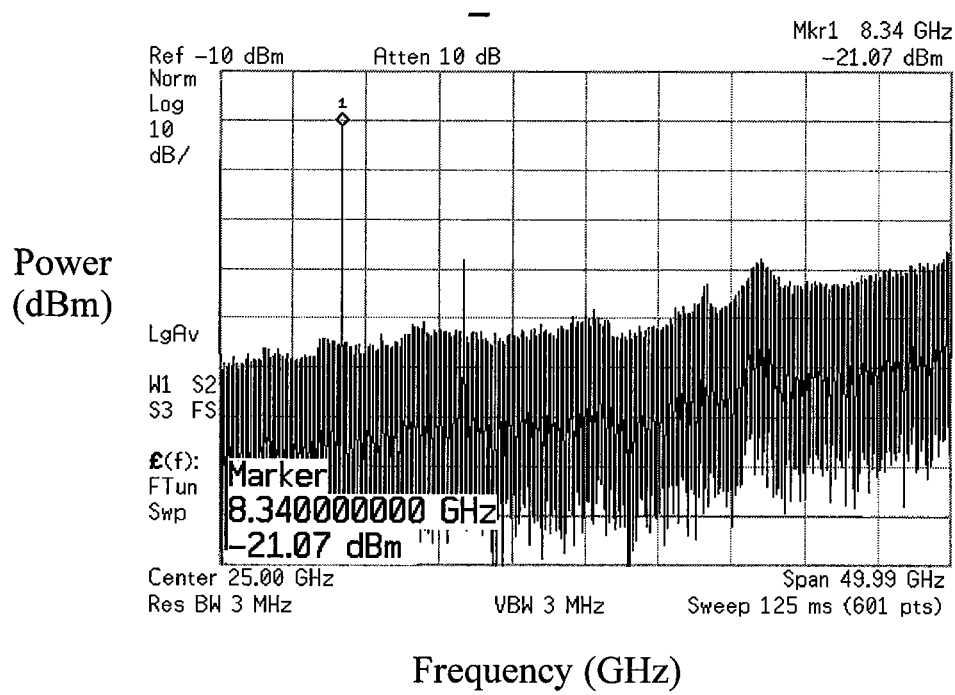
FIGS. 5 through 9 are the experimental results of the assistant measuring circuit according to the invention for the eight-phase voltage-controlled oscillator.
Figure 6:
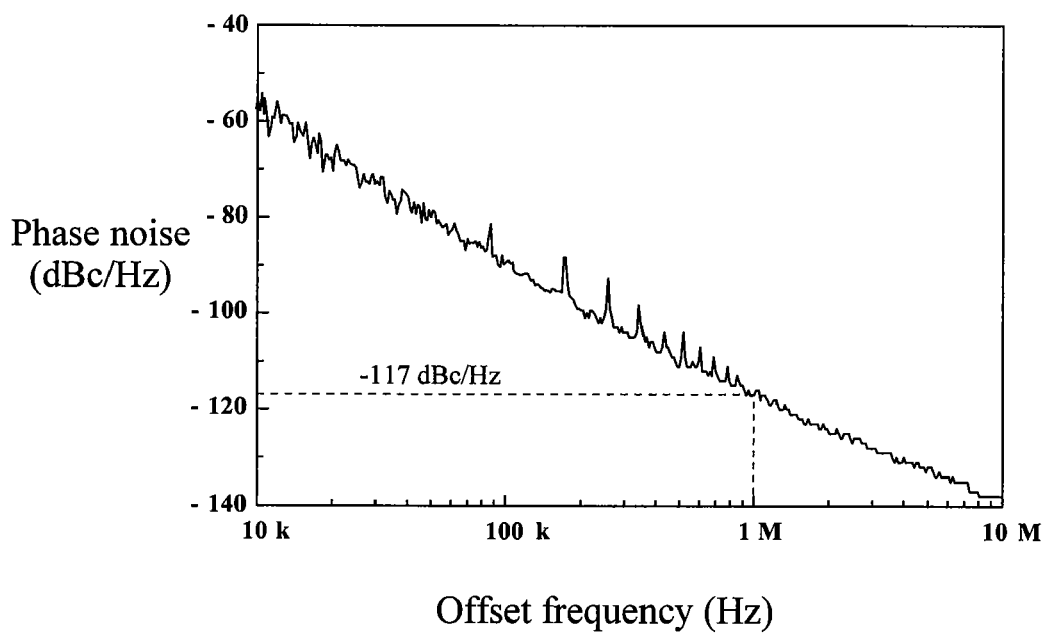
Figure 7:
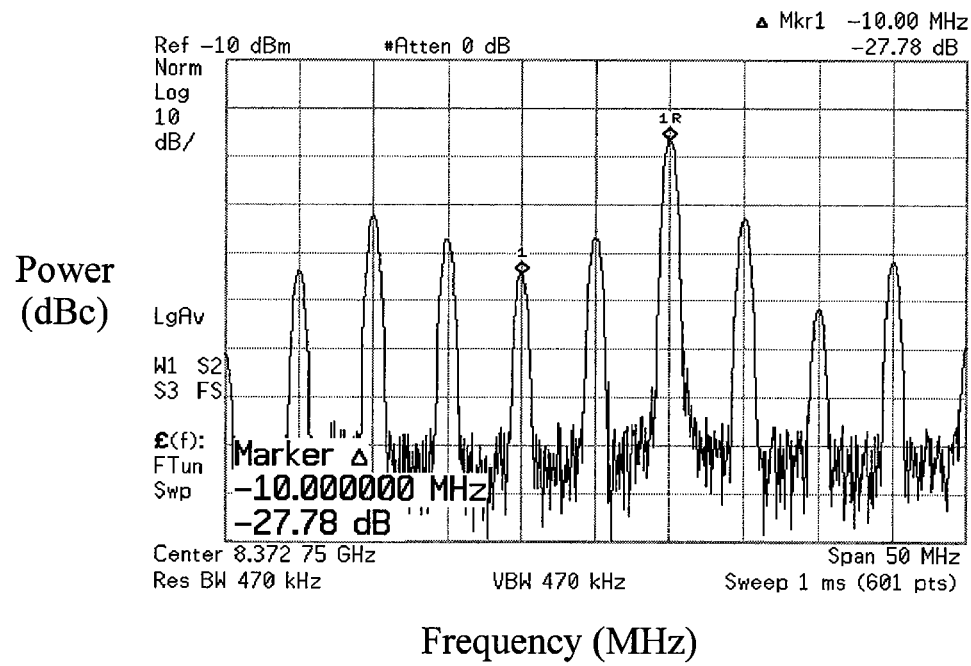

The applicant has applied the assistant measuring circuit, according to the invention, to the eight-phase voltage-controlled oscillator, as shown in FIG. 3. FIGS. 5 through 7 are experimental results when setting the voltages at the signal control ends (36A~36H) respectively as 1.8V, 0V, 0.9V, 0.9V, 1.8V, 0V, 0.9V, and 0.9V.

FIG. 5 is the output-signal spectrum of the measuring end (MEAS). It is observed from FIG. 5 that the main frequency and the output power of the output signal is 8.34 GHz and −21.07 dBm, respectively. FIG. 6 shows the output-signal phase noise of the measuring end (MEAS). It is observed that when the offset frequency is 1 MHz, the output-signal phase noise is about −117 dBc/Hz.

FIG. 7 is the spectrum of the side-band suppression of the measuring end (MAES). It is observed that the amount of the side-band suppression of the output signal is about −26.48 dBc. According to the side-band suppression, a relative amplitude and a relative phase error can be determined to further calculate the phase error of each signal. As a result, it can be analyzed in FIG. 7 that the amplitude difference and phase error of the four oscillating signals with phases of 0°, 90°, 180°, and 270°, are within 0.85 dB and 5°, respectively.

Figure 8:
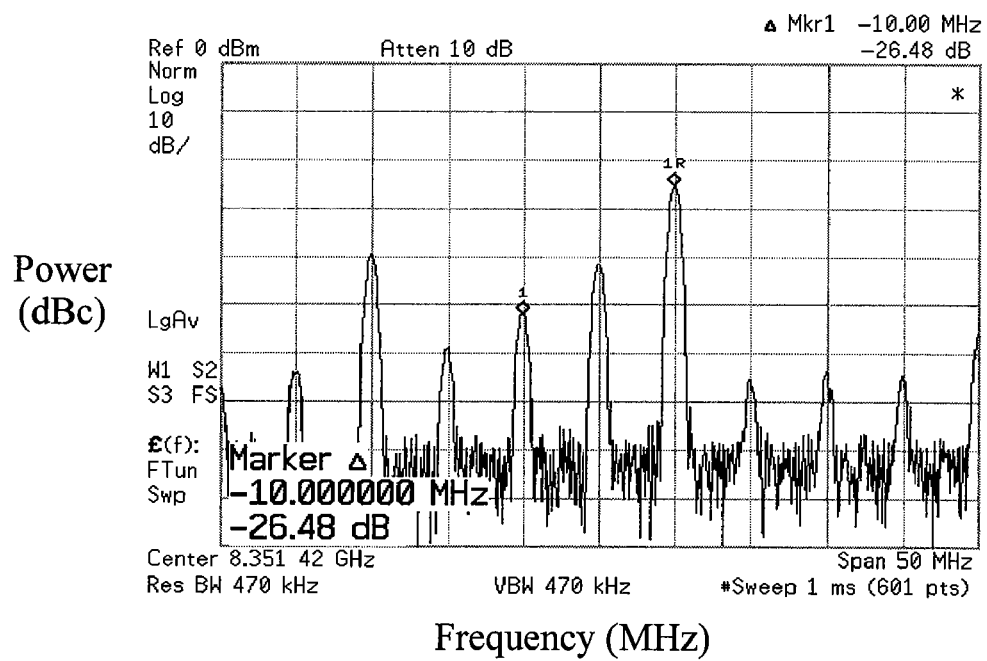

In the same way, a tester can close the reflection-type modulators for transmitting oscillating signals with phases of 0°, 90°, 180°, and 270°, and then measure the oscillating signals with phases of 45°, 225°, 135°, and 315°. FIG. 8 is the spectrum of the side-band suppression by measuring the oscillating signals with phases of 45°, 225°, 135°, and 315°. It is revealed in FIG. 8 that the side-band suppression of the output signal from the measuring end (MEAS) is about −26.48 dBc. Besides, it can be analyzed in FIG. 8 that the amplitude difference and phase error of the four oscillating signals with phases of 45°, 225°, 135°, and 315° are within 0.85 dB and 5°, respectively.

Figure 9:
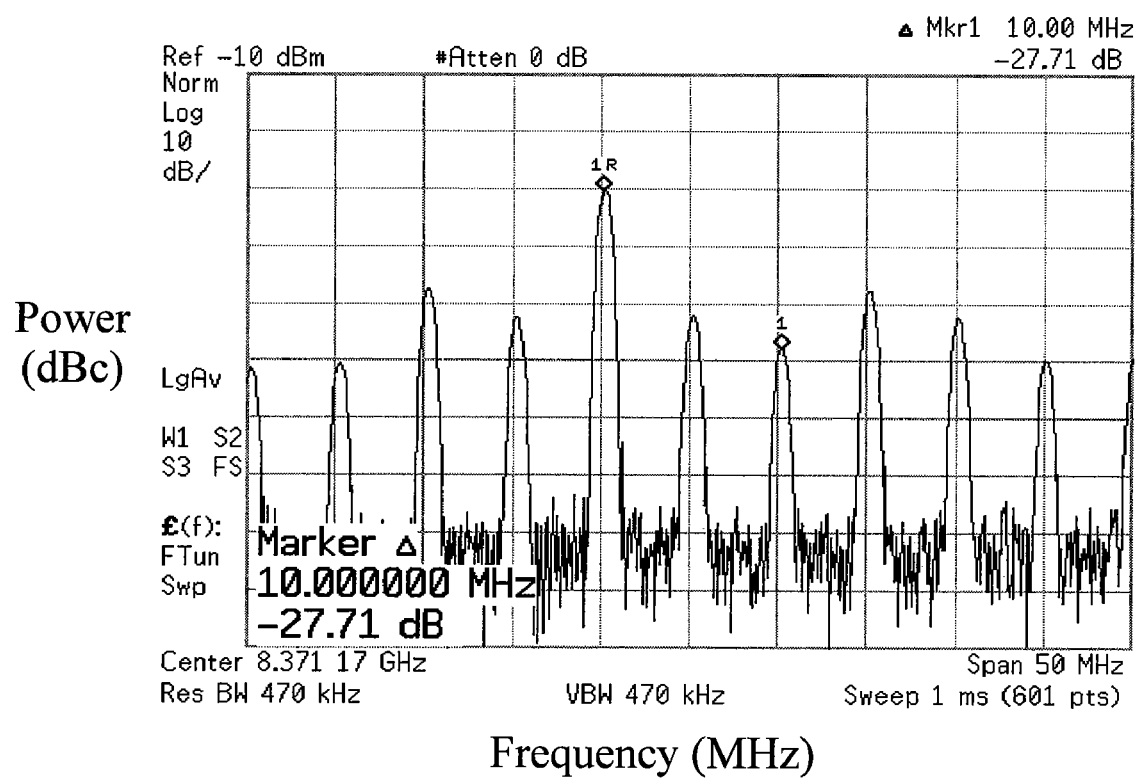

In addition, a tester can close the reflection-type modulators for transmitting oscillating signals with phases of 90°, 135°, 270°, and 315°, and then measure the oscillating signals with phases of 0°, 45°, 180°, and 225°. FIG. 9 is the spectrum of the side-band suppression by measuring the oscillating signals with phases of 0°, 45°, 180°, and 225°. It is revealed in FIG. 9 that the side-band suppression of the output signal from the measuring end (MEAS) is about −27.71 dBc. It can also be analyzed in FIG. 9 that the amplitude difference and phase error of the four oscillating signals with phases of 0°, 45°, 180°, and 225° are also within 0.85 dB and 5°, respectively.

From the above experimental results, the applicant has proved that applying the assistant measuring circuit according to the invention to the eight-phase voltage-controlled oscillator is feasible, and it has also proved that the amplitude differences and phase errors of the multiple-phase output signals are determined certainly by utilizing the assistant measuring circuit according to the invention.

Another characteristic of the assistant measuring circuit in accordance with the invention is a wide application to every kind of multiple-phase voltage-controlled oscillator. More specifically, the assistant measuring circuit can also be used for the oscillator whose phase number is not equal to 8. For the oscillator whose phase number is equal to N (N is a positive integer and bigger than 1), the assistant measuring circuit in accordance with the invention contains N buffers, N reflection-type modulators, and a controller.

An ith buffer among the N buffers is electrically connected to the oscillator. The ith buffer is for receiving and further transmitting an ith oscillating signal among the N oscillating signals (i is an integer between 1 and N). An ith reflection-type modulator among the N reflection-type modulators, electrically connected to the ith buffer, has an ith signal input end, an ith signal output end, and an ith signal control end. The ith oscillating signal is transmitted to the ith signal input end through the ith buffer, and all the signal output ends of the N modulators are electrically connected to a measuring end. The controller is for providing an ith control signal to the ith signal control end.

Besides, no matter a plurality of oscillating units in the oscillator are coupled to each other in parallel-coupling, series-coupling, or body-coupling, the amplitude differences and phase errors can be determined by the assistant measuring circuit according to the invention.

According to another embodiment of the invention, it is related to an oscillating system including the assistant measuring circuit and oscillator as shown in FIG. 3. Since associated principles and operations are disclosed in the above embodiments, thus they will not be repeated therein.

As described above, signals with different phases can be integrated by the reflection-type modulators in the assistant measuring circuit according to the invention. By adjusting each reflection-type modulator, the signals after integration are used for determining the amplitude differences and phase errors of the output signals. In addition to a simple structure and precise results, the main advantage of the assistant measuring circuit is to decrease the difficulty of measuring multiple-phase signals.

With the example and explanations above, the features and spirits of the invention will be hopefully well described. Those skilled in the art will readily observe that numerous modifications and alterations of the device may be made while retaining the teaching of the invention. The above disclosure should be construed as limited only by the metes and bounds of the appended claims.

What is claimed is:

1. An assistant measuring circuit for an oscillator providing 8 oscillating signals with 8 different phases of 0°, 45°, 90°, 135°, 180°, 225°, 270°, and 315°, the assistant measuring circuit comprising:
    8 buffers, an ith buffer among the 8 buffers being electrically connected to the oscillator, the ith buffer receiving and further transmitting an ith oscillating signal among the 8 oscillating signals, i being an integer between 1 and 8;
    8 reflection-type modulators, an ith modulator among the 8 modulators being electrically connected to the ith buffer and having an ith signal input end, an ith signal output end, and an ith signal control end, the ith oscillating signal being transmitted to the ith signal input end through the ith buffer, and all the signal output ends of the 8 modulators being electrically connected to a measuring end; and
    a controller, electrically connected to each of the ith signal control ends, for providing an ith control signal to each of the ith signal control ends so as to close the reflection-type modulators for the 45°, the 135°, the 225°, and the 315° signals and to delay the 0° and 270° signals by 90° and the 90° and 180° signals by 270° to obtain two sets of quadrature signals or to close the reflection-type modulators for the 0°, the 90°, the 180°, and the 270° signals or to close the reflection-type modulators for the 90°, the 135°, the 270°, and the 315° signals.

2. The assistant measuring circuit of claim 1, wherein the ith reflection-type modulator comprises a 90-degree hybrid and two cold-mold transistors.

3. The assistant measuring circuit of claim 2, wherein each of the cold-mold transistors is an n-type MOSFET (Metal-Oxide-Semiconductor Field-Effect Transistor).

4. The assistant measuring circuit of claim 2, wherein the 90-degree hybrid is a broadside coupler, a Lange coupler, or an edge coupler.

5. The assistant measuring circuit of claim 1, wherein the ith reflection-type modulator has a reflection coefficient, and the controller changes the reflection coefficient by adjusting the ith control signal.

6. The assistant measuring circuit of claim 1, wherein when the ith control signal is equal to a first voltage, a phase difference between an ith output signal of the ith signal output end and the ith oscillating signal equals 270 degrees approximately, and the ith output signal falls behind the ith oscillating signal; when the ith control signal is equal to a second voltage, the phase difference also equals 270 degrees approximately, and the ith output signal leads the ith oscillating signal; when the ith control signal is equal to a third voltage, the ith signal output end is closed.

7. The assistant measuring circuit of claim 1, wherein the oscillator comprises plural oscillating units, and the oscillating units are coupled to each other in parallel-coupling, series-coupling, or body-coupling.

8. The assistant measuring circuit of claim 1, wherein the ith buffer is a common-gate amplifier, a common-source amplifier, or a common-drain amplifier.

9. An oscillating system, comprising:
    an oscillator providing 8 oscillating signals with 8 different phases of 0°, 45°, 90°, 135°, 180°, 225°, 270°, and 315°;
    8 buffers, an ith buffer among the 8 buffers being electrically connected to the oscillator, the ith buffer being for receiving and further transmitting an ith oscillating signal among the 8 oscillating signals;
    8 reflection-type modulators, an ith modulator among the 8 modulators being electrically connected to the ith buffer and having an ith signal input end, an ith signal output end, and an ith signal control end, the ith oscillating signal being transmitted to the ith signal input end through the ith buffer, and all the signal output ends of the 8 modulators being electrically connected to a measuring end; and a controller, electrically connected to each of the ith signal control ends, for providing an ith control signal to each of the ith signal control ends so as to close the reflection-type modulators for the 45°, the 135°, the 225°, and the 315° signals and to delay the 0° and 270° signals by 90° and the 90° and 180° signals by 270° to obtain two sets of quadrature signals or to close the reflection-type modulators for the 0°, the 90°, the 180°, and the 270° signals or to close the reflection-type modulators for the 90°, the 135°, the 270°, and the 315° signals.

10. The oscillating system of claim 9, wherein the ith reflection-type modulator comprises a 90-degree hybrid and two cold-mold transistors.

11. The oscillating system of claim 10, wherein each of the cold-mold transistors is an n-type MOSFET.

12. The oscillating system of claim 10, wherein the 90-degree hybrid is a broadside coupler, a Lange coupler, or an edge coupler.

13. The oscillating system of claim 9, wherein the ith reflection-type modulator has a reflection coefficient, and the controller changes the reflection coefficient by adjusting the ith control signal.

14. The oscillating system of claim 9, wherein when the ith control signal is equal to a first voltage, a phase difference between an ith output signal of the ith signal output end and the ith oscillating signal equals 270 degrees approximately, and the ith output signal falls behind the ith oscillating signal; when the ith control signal is equal to a second voltage, the phase difference also equals 270 degrees approximately, and the ith output signal leads the ith oscillating signal; when the ith control signal is equal to a third voltage, the ith signal output end is closed.

15. The oscillating system of claim 9, wherein the oscillator comprises plural oscillating units, and the oscillating units are coupled to each other in parallel-coupling, series-coupling, or body-coupling.

16. The oscillating system of claim 9, wherein the ith buffer is a common-gate amplifier, a common-source amplifier, or a common-drain amplifier.

* * * * *